United States Patent [19]
Rieder et al.

[11] Patent Number: 5,349,310
[45] Date of Patent: Sep. 20, 1994

[54] DIGITALLY CONTROLLED FRACTIONAL FREQUENCY SYNTHESIZER

[75] Inventors: Klaus-Hartwig Rieder, Stuttgart; Gunter Horsch, Weil der Stadt, both of Fed. Rep. of Germany; William E. Powell, Raleigh, N.C.

[73] Assignee: Alcatel Network Systems, Inc., Richardson, Tex.

[21] Appl. No.: 74,060

[22] Filed: Jun. 9, 1993

[51] Int. Cl.$^5$ .............................................. H03L 7/06
[52] U.S. Cl. ...................................... 331/18; 331/25
[58] Field of Search ......................... 331/1 A, 18, 25

[56] References Cited

U.S. PATENT DOCUMENTS

| | | | |
|---|---|---|---|
| 3,959,737 | 5/1976 | Tanis | 331/1 A |
| 4,107,612 | 8/1978 | Levegue | 331/18 X |
| 4,849,993 | 6/1989 | Johnson et al. | 375/108 |
| 4,866,739 | 9/1988 | Agazzi et al. | 375/106 |
| 4,868,524 | 9/9189 | Costlow et al. | 331/25 X |
| 4,893,094 | 1/1990 | Herold et al. | 331/25 X |
| 4,933,955 | 6/1990 | Warren et al. | 375/20 |

OTHER PUBLICATIONS

Supercomm ICC '92 Network Synchronization Workshop; Handout, entitled" Introduction of Clocks–Architectures Old ST3 vs. New ST3-E" Jun. 16, 1992, by Tony Warren.
"Digital PLL Frequency Synthesizers–Theory and Design", U. Rohde, Prentice-Hall, Inc., 1983, Englewood Cliffs NJ, pp. 124–125, 128–129, 132–133, 136–137 and 140–141.
Application Note 412, Issue 2, dated Mar. '92, *Telecom Solutions ST3-E*.
"Digital Clock, Distributor", DCD-419:2, Introduction, *Telecom Solutions* dated 1992.
85 MHz Direct Digital Synthesizer AD9955, Specification Sheets, *Analog Devices*, Rev. 0, Oct. 1992.
AN-237 Application Note, "Choosing DACs for Direct Digital Synthesis", *Analog Devices*, Jul. 1992.
"Neue Taktgeneratoren für EWSD", W. Ernst et al, *Telecom Report 9* (1986), Brochure 4, pp. 263–269.

*Primary Examiner*—Siegfried H. Grimm
*Attorney, Agent, or Firm*—Ware, Fressola, Van Der Sluys & Adolphson

[57] ABSTRACT

The circuit arrangement of the invention presents an oscillator, whose frequency can be linearly varied within a wide control range, without affecting the oscillator's stability. The frequency of a fixed frequency generator (1) is divided to the desired frequency by a frequency divider (2), whose divider ratio can be varied in very small steps, and the resulting jitter is filtered out by a very simple phase control circuit (3). Improved short-term stability and holdover performance are also achieved. The oscillator can be universally used as clock generator in all digital circuit arrangements.

4 Claims, 3 Drawing Sheets

DIGITALLY CONTROLLED FRACTIONAL FREQUENCY SYNTHESIZER

TECHNICAL FIELD

The invention relates to a circuit arrangement, which, for example, may be the basis for a clock generator in a digital message transmission system.

BACKGROUND OF THE INVENTION

High quality oscillators with long-term reliability are needed to ensure the interference-free transmission of digital messages. Quartz oscillators are generally used for such purposes, which are tuned by a microprocessor and a digital/analog converter, and form part of a phase control circuit, e.g., a basic phase-locked loop, see W. Ernst, Hartmann H. L.: New clock generators for EWSD, telecom report 9 (1986), brochure 4, pages 263–269.

Fairly expensive circuits are needed to fulfill the high accuracy and stability requirements of a clock generator, for example microprocessor-controlled digital phase control circuits (DPLLs) are used. Still, the physical characteristics of a controllable quartz oscillator set certain limits. Thus, a compromise must always be found between control range ("pulling" range of voltage-Controlled Crystal Oscillator (VCXO)) and stability, because the stability of the quartz oscillator decreases as the control range increases, thereby limiting the control range. Because of the nonlinearity of the control curve (voltage/frequency characteristic of "Kv"), which describes the function of the control voltage vs. frequency, tolerances of ±50% must be taken into account when the circuit is constructed. Therefore, the phase control circuit must be designed for amplification fluctuations (variations of "Kv" value) of ±50%, with a bandwidth tolerance of ±50%. Finally, the resolution of the control range is limited by the step width of the digital/analog converter, where temperature changes and nonlinearities are additional variables in the operation of the digital/analog converter. As a rule, digital/analog converters must be supplied with at least ±12 V of operating voltage. In tunable oven-controlled quartz oscillators, low long-term stability, temperature dependence and nonlinearity of the control curve are characteristics that result in problems with the creation of highly accurate clock generators.

DISCLOSURE OF INVENTION

An object of the present invention is to introduce a cost-effective and universally applicable oscillator, which, while maintaining close tolerances, can be continuously controlled over a wide range without affecting its stability.

According to the present invention, a stable, fixed-frequency oscillator provides a fixed-frequency signal to a variable divider circuit which in turn provides a variable-frequency output to a phase-locked loop circuit.

In further accord with the present invention, the variable divider circuit may comprise an adder responsive to a microprocessor interface at a first input thereof and to a register output at a second input thereof for providing a summed signal at a data output thereof and a carry signal at a carry output thereof. The data output of the adder is provided to a register clocked by the fixed-frequency input. The variable divider circuit may also comprise a cycle stealing unit, responsive to the carry output of the adder and to the fixed-frequency signal for providing a cycle stealing output signal to a fixed divider which in turn provides the output of the variable divider to the phase-locked loop.

In further accord with the present invention the phase-locked loop may comprise an analog phase comparator for comparing an output of the phase-locked loop to the output of the variable divider. The output of the phase comparator is provided to a voltage-controlled crystal oscillator for providing an analog phase-locked loop output.

In still further accord with the present invention, instead of providing the fixed frequency to a variable divider circuit, it is provided to a fixed divider which in turn provides an output to one of the inputs of the phase comparator of the phase-locked loop. The output of the phase-locked loop is provided to the variable divider circuit which provides its output as the second input to the phase comparator of the phase-locked loop. In this case, the variable divider circuit may comprise an adder, responsive at a first input to a microprocessor interface and at a second input to an output of a register clocked by a divided version of the output of the phase-locked loop. The data output of the adder is provided to the register while the carry output is provided to a cycle stealing unit responsive to the output of the phase-locked loop for providing a cycle stealing output that may be divided and provided as the output of the variable divider circuit to the second input of the phase comparator of the phase-locked loop.

In accordance still further with the present invention, the variable divider may comprise an adder, responsive at a first input thereof to a microprocessor interface and at a second input thereof to a register output, which register is clocked by a divided fixed-frequency signal from the stable reference oscillator and which registers a data output of the adder. A carry output of the adder is provided to a first cycle stealer which is also responsive to the fixed-frequency signal from the stable oscillator. The output of the first cycle stealer is provided to a divider which provides its output to a first input of a phase comparator within phase-locked loop. A second cycle stealer within the variable divider is responsive to the carry output of the adder and to the output of the phase-locked loop for providing an output signal which is divided and provided at a second input of the phase comparator of the phase-locked loop. The output of the phase-locked loop may be divided again, if desired.

The essence of the invention is that the desired frequency is derived from an oven-stabilized standard fixed frequency oscillator, essentially through a frequency divider, whose divider ratio can be varied in any desired manner. A digital/analog converter is no longer required, so that the clock generator now requires a conventional 5-Volt operating voltage. The circuit arrangement according to the invention is able to change the frequency linearly in a range of, for example, ±70 ppm, without affecting the stability of the oscillator at all. Therefore, the ageing of the fixed frequency oscillator can be compensated for without any problems.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
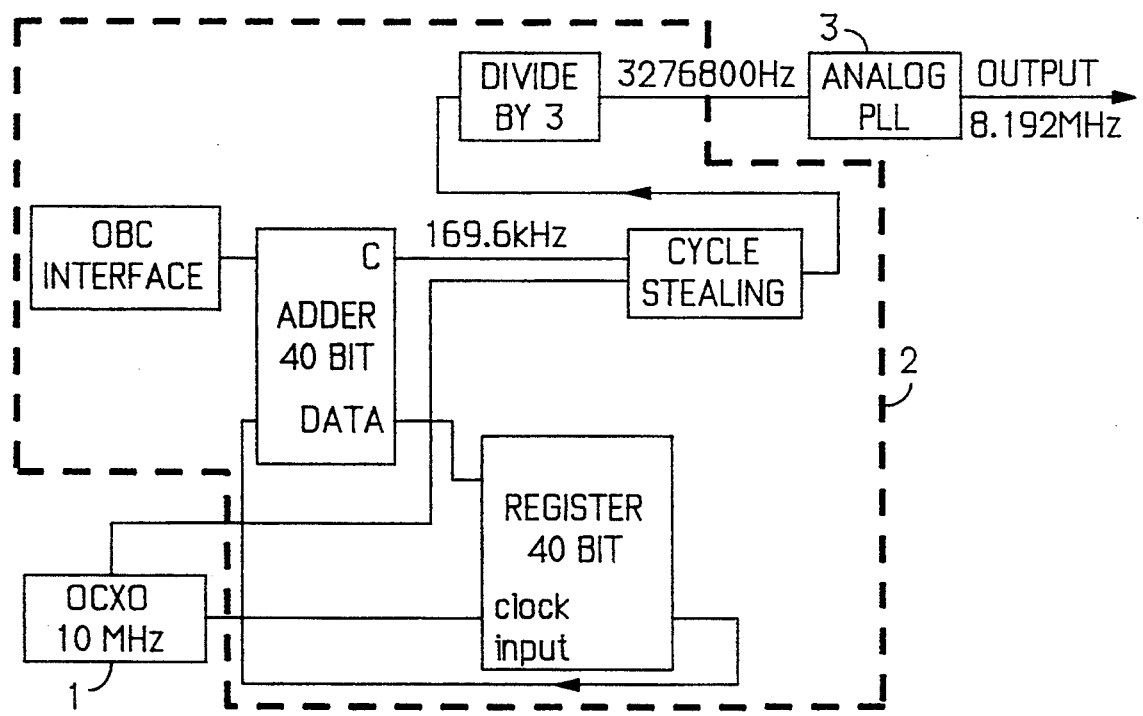
FIG. 1 shows a block circuit diagram of a circuit arrangement according to the invention.

According to FIG. 1, the circuit arrangement for a controllable oscillator consists of an oven-stabilized fixed frequency generator 1 (Oven Controlled Crystal Oscillator (OCXO)), a frequency divider 2 with variable divider ratio, and an analog phase control circuit 3 (Phase-Locked Loop (PLL)). The frequency divider 2 comprises essentially a register and an adder, which is controlled by a microprocessor through an On-Board Controller (OBC) Interface, and if required, of cycle stealing circuits and frequency dividers with a fixed divider ratio, dividing by 3 for example, in this instance. According to FIG. 2, the analog phase control circuit 3 includes a phase comparator (Kp), an active loop filter with an operational amplifier and a Voltage-Controlled Crystal Oscillator (VCXO), and if required, a frequency divider (DIV), which makes the reference frequency available for the phase comparator. The analog phase-locked loop circuit 3 is designed in this example as follows:

| | |
|---|---|
| R = 10,000 ohm | C = 15.9 nF |
| R1 = 872,340 Ohm | C1 = 75 nF |
| R2 = 1,000,000 Ohm | C2 = 159 pF |

The slope of the phase comparator in that case is $Kp=0.4$ V/rad. The control slope of the voltage-controlled oscillator VCXO may be $Kv=204.8$ Hz/V.

In the circuit arrangement in FIG. 1, the fixed frequency generator 1 cycles the register, whose content is added in the adder to a digital control value supplied by the microprocessor OBC. The carry output of the adder then contains a pulse sequence, whose frequency can be varied by the digital control value of the microprocessor OBC. The average frequency at the carry output $$f_{carry}(\text{AVG}) = f_{OCXO}\left[\frac{M}{2^m}\right]$$

increases when the digital control value is increased and the frequency of the fixed frequency generator 1 stays the same (where M is the OBC value and m is the number of bits in the phase accumulator circuit). This makes it possible to vary the frequency in very small steps. For example, the output frequency f2 (nominal)=169.6 kHz of the adder is subtracted from the frequency f1=10 MHz of the fixed frequency generator by means of a so-called cycle stealing or clock-gapping circuit. A frequency divider divides the resulting f3=9.8304 MHz (nominal) by 3, and supplies it to the analog phase-locked loop circuit 3. In the circuit according to the invention, the analog phase-locked loop circuit 3 is not used as a frequency determining component of the clock generator, as is the case in the known state of the art, it rather serves only to filter out jitter from the clock gapping, and to provide a simple frequency multiplication function if desired. The jitter is kept within narrow limits by the analog phase control circuit 3 of very simple construction, with a conventional quartz oscillator. Its closed-loop bandwidth may, for example, be on the order of 90 Hz. Less than 280 picoseconds of jitter within a control range of ±7 ppm is achieved at the output frequency f4=8.192 MHz with the circuit shown in FIG. 1, and with the above mentioned construction of the analog phase control circuit 3.

Figure 2:
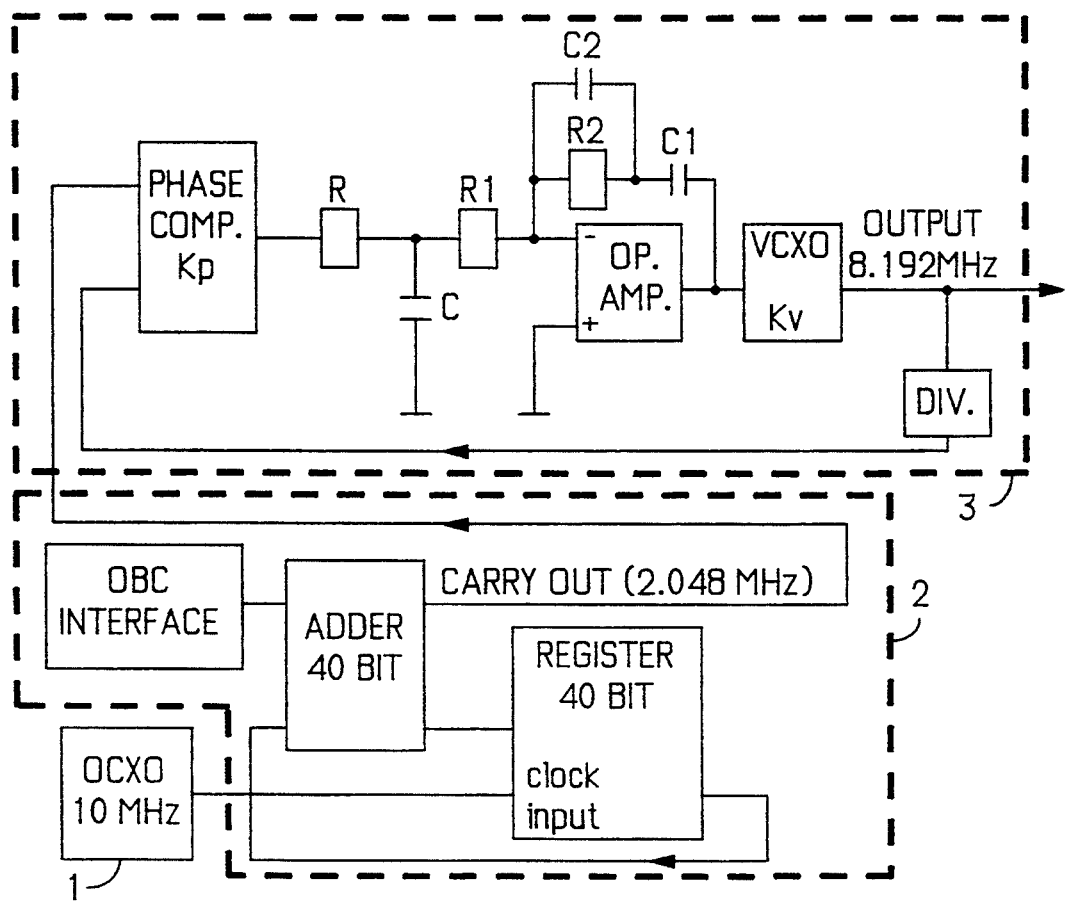
FIG. 2 shows a first variation with the switching detail of an analog phase control circuit.

As compared to the circuit shown in FIG. 1, the circuit arrangement in FIG. 2, in which the cycle stealing circuit with downstream frequency divider is omitted, is sufficient for many applications. This simple and universal solution creates jitter of less than 800 picoseconds, with the indicated construction.

Figure 3:
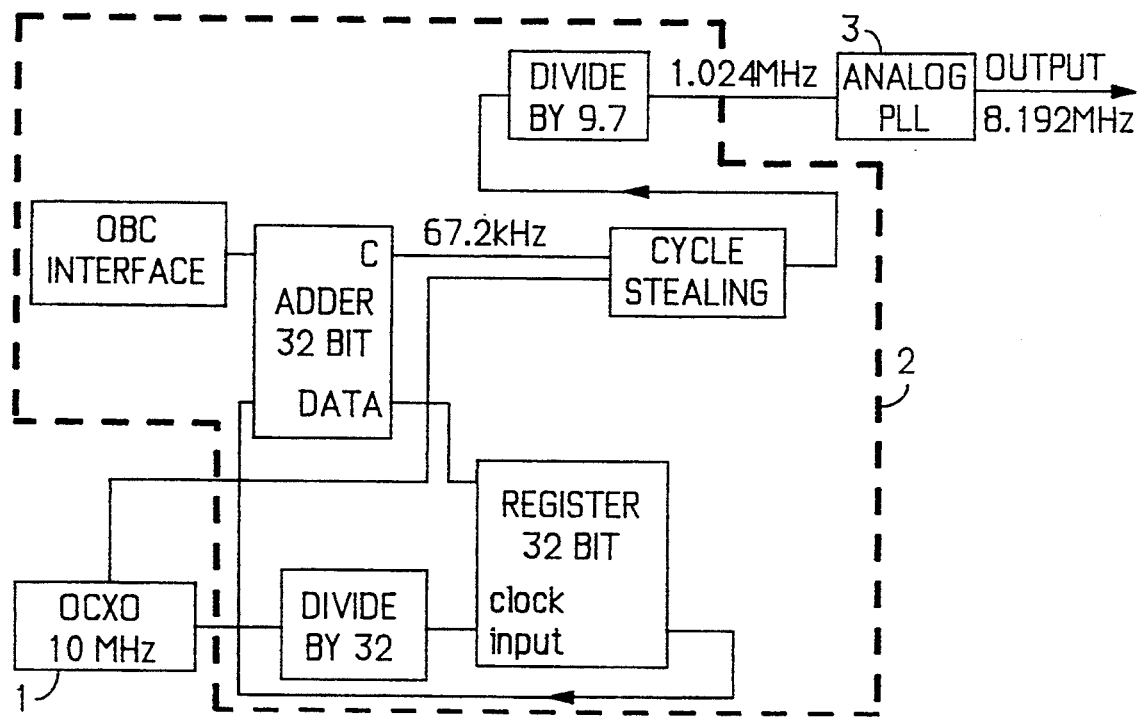
FIG. 3 shows a second variation of the circuit arrangement according to the invention.
Figure 4:
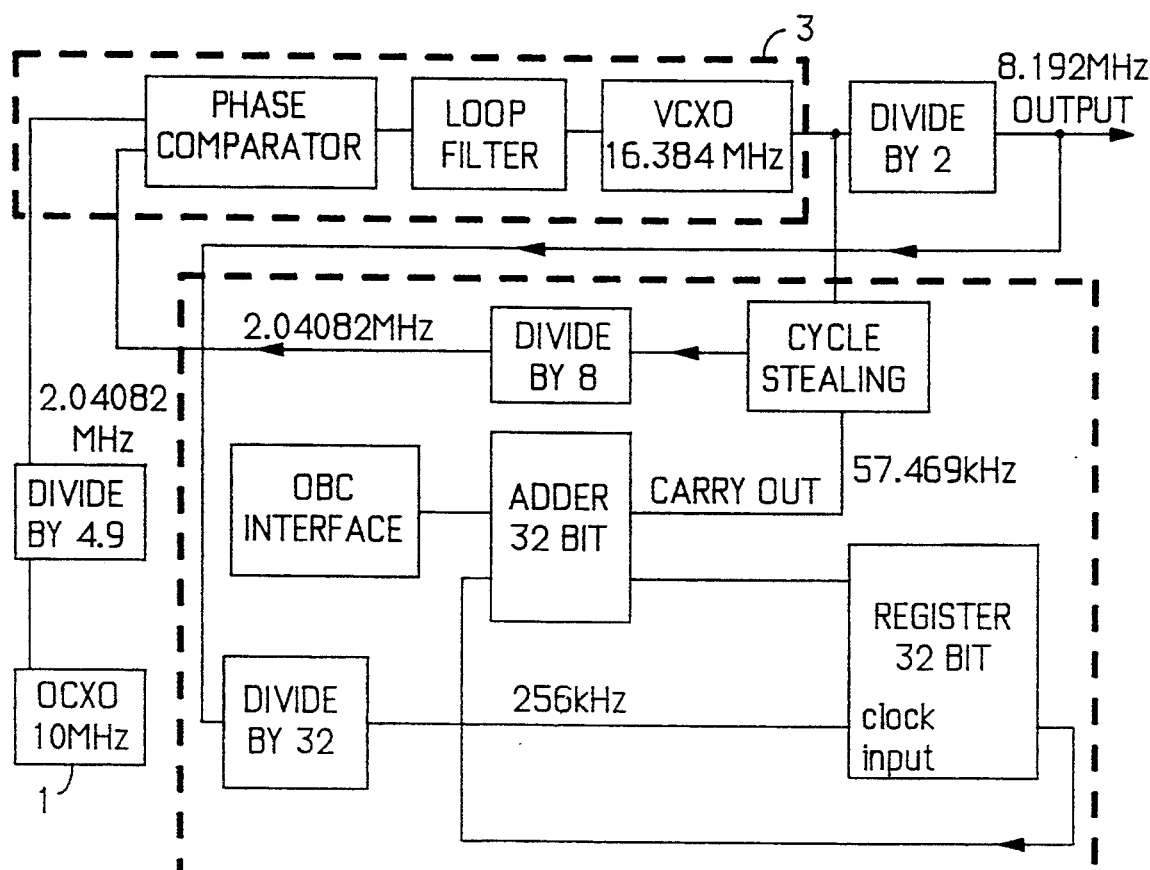
FIG. 4 shows a third variation of the circuit arrangement according to the invention.
Figure 5:
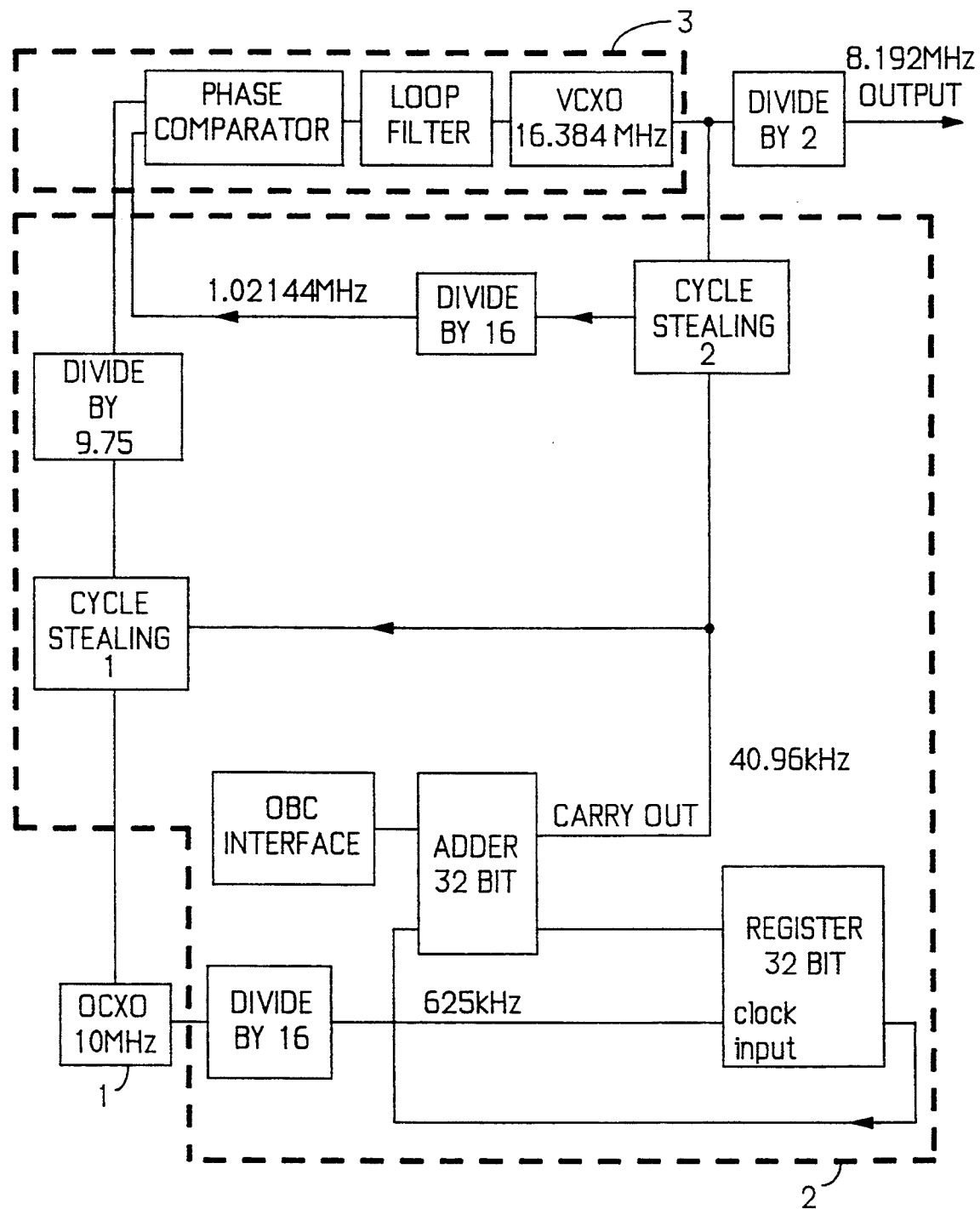
FIG. 5 shows a fourth variation with two cycle stealing circuits.

FIGS. 3, 4 and 5 depict variations of the circuit arrangement according to the invention, which differ with respect to type of frequency preparation, and are advantageous depending on output frequency and permissible jitter.

According to FIG. 3, the frequency f1=10 MHz of the fixed frequency generator 1 is first divided by 32 by a frequency divider, prior to further processing with the same circuit structure shown in FIG. 1. This circuit has the advantage that the bit-width of register and adder is only 32 bits, so as to achieve comparable control accuracy.

FIG. 4 illustrates a circuit arrangement in which the frequency f1=10 MHz of fixed frequency generator 1 is divided to a frequency f=2.04082 MHz, and is then supplied to the phase detector as nominal frequency. The reference frequency is formed by cycle stealing from the difference of the output pulse frequency of the analog phase control circuit 3 and the output frequency of the adder, by a frequency divider that is switched downstream of the cycle stealing circuit. Such a circuit arrangement is suitable when frequencies are produced in which the jitter is smaller than in the previously cited circuit arrangements.

FIG. 5 depicts a circuit variation, in which both the nominal frequency and the reference frequency for the phase detector of the analog phase control circuit 3 are formed from the frequency differences by cycle stealing circuits. However, the basic circuit structure remains. The circuit variation is especially advantageous when particularly low jitter frequencies must be produced.

The circuit arrangement according to the invention can be used to produce clock generators with different frequencies by means of the same oven-stabilized fixed frequency generator. This universal utilization permits to produce such controllable oscillators in large numbers, thereby cost effectively. The circuit arrangement can be realized exclusively with components requiring a supply voltage U=+5 V, and can be used in conventional message transmission installations without any problems.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A controllable oscillator, comprising a fixed frequency generator (1) connected to a frequency divider (2) with an adjustable divider ratio, wherein the output of the frequency divider (2) is connected to the input of a phase detector of an analog phase control circuit (3), wherein the frequency divider (2) comprises a register, whose output is connected to a first input of an adder, wherein a second input of the adder is connected to a microprocessor (OBC), and wherein an output of the adder is connected to a nominal frequency input of the phase detector of the analog phase control circuit (3).

2. The controllable oscillator of claim 1, wherein the output of the adder is connected to a first input of a cycle stealing circuit, wherein a second input of the cycle stealing circuit is connected to the output of the fixed frequency generator (1), and wherein a frequency divider with a fixed divider ratio is connected to an output of the cycle stealing circuit and wherein an output of the divider with a fixed divider ratio is connected to the nominal frequency input of the phase detector.

3. The controllable oscillator of claim 1, wherein the fixed frequency generator (1) is connected on the one hand to the register by a frequency divider with a fixed divider ratio, and on the other is switched through a first cycle stealing circuit, which forms a difference between the frequency of the fixed frequency generator (1) and the frequency of the adder's output pulses, and provides the difference to the nominal frequency input of the phase detector in the analog phase control circuit (3), by means of a downstream frequency divider, and wherein the output of the adder is connected through a second cycle stealing circuit, which forms the difference between the frequency of the adder's output pulses and the output frequency of the analog phase control circuit (3), to the comparison frequency input of the phase detector in the analog phase control circuit (3), by means of a downstream frequency divider.

4. A controllable oscillator, comprising a fixed frequency generator (1) connected to a frequency divider (2) with a dynamically controlled divider ratio, wherein the output of the frequency divider (2) is connected to the input of a phase detector of an analog phase control circuit (3), wherein the fixed frequency generator (1) is connected to the nominal frequency input of the phase detector through a frequency divider, wherein the input of the frequency divider (2) with a dynamically controlled divider ratio is connected to the output of the analog phase control circuit (3), and wherein the output of the frequency divider (2) with a dynamically controlled divider ratio is connected to the comparison frequency input of the phase detector in analog phase control circuit (3), wherein the frequency divider with a dynamically controlled divider ratio comprises an adder having one input connected to a register and another input to a signal processor, the adder having one output connected to an input of the register and a carry output of the adder used as the output of the frequency divider (2) and wherein the fixed frequency generator (1) is connected to a clock input of the register.

* * * * *